United States Patent [19]

Kawasaki et al.

[11] Patent Number: 5,148,048
[45] Date of Patent: Sep. 15, 1992

[54] CMOS OUTPUT CIRCUIT HAVING CONTROLLED SLOPE

[75] Inventors: Masayuki Kawasaki; Kiyomitsu Takatani, both of Ooita, Japan

[73] Assignee: Kabushiki Kaisha Toshiba, Kawasaki, Japan

[21] Appl. No.: 709,385

[22] Filed: Jun. 3, 1991

[30] Foreign Application Priority Data

Jun. 4, 1990 [JP] Japan .................................. 2-144411

[51] Int. Cl.⁵ ........................ H03B 1/04; H03K 5/12
[52] U.S. Cl. ................................. 307/263; 307/443; 307/451; 307/542; 307/571
[58] Field of Search ............... 307/263, 443, 451, 542, 307/571, 587

[56] References Cited

U.S. PATENT DOCUMENTS 4,626,715 12/1986 Ishii ......................................... 307/571
4,682,055 7/1987 Upadhyayuk ......................... 307/443
4,714,840 12/1987 Proebsting ........................... 307/443
4,970,407 11/1990 Patchen ................................ 307/279
5,039,873 8/1991 Sasaki .................................. 307/262

Primary Examiner—Stanley D. Miller
Assistant Examiner—Margaret Rose Wambach
Attorney, Agent, or Firm—Finnegan, Henderson, Farabow, Garrett and Dunner

[57] ABSTRACT

Two p-channel MOS transistors are inserted in series between the positive power supply and the output terminal, whereas two n-channel MOS transistors are inserted in series between the output terminal and the negative power supply. Across the source and drain of one of the p-channel MOS transistors, a first diode is connected in parallel in the forward direction. Similarly, across the source and drain of one of the n-channel MOS transistors, a second diode is connected in parallel in the forward direction.

4 Claims, 3 Drawing Sheets

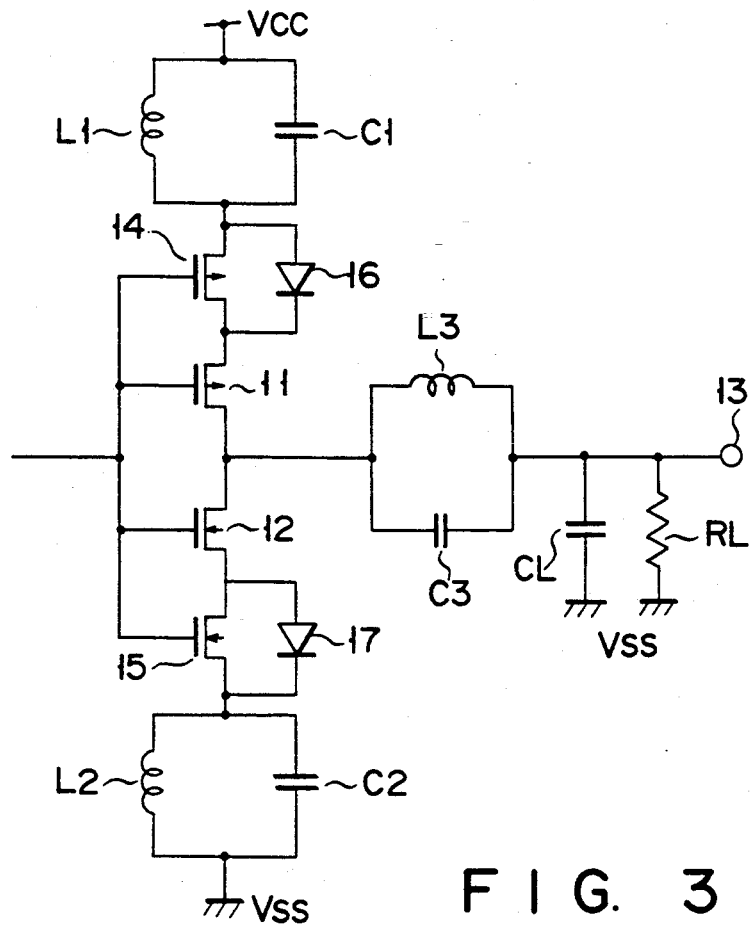
F I G. 3
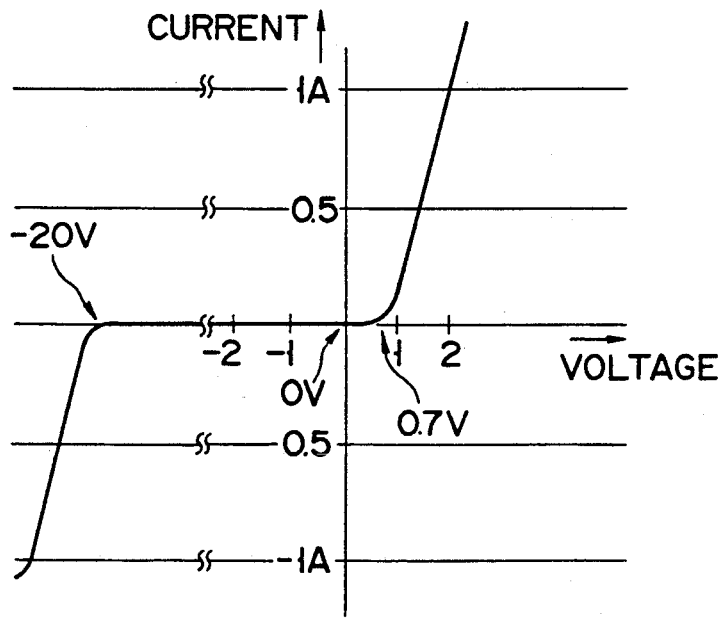
F I G. 4

CMOS OUTPUT CIRCUIT HAVING CONTROLLED SLOPE

BACKGROUND OF THE INVENTION

1. Field of the Invention

This invention relates to a CMOS output circuit provided in the output stage of a CMOS semiconductor integrated circuit.

2. Description of the Related Art

With higher packing density and larger-scale integration, semiconductor integrated circuits (ICs) and large-scale integrated circuits (LSIs) operate even faster but consume more power.

In the output circuit built in a high-speed CMOS IC, to shorten the charging and discharging time of the output load capacity, the W/L or the conductance gm of the MOS transistor in the IC is set at a large value so that large current may be drawn from the output terminal. Here, W in the W/L is the gate length, or the gate width, of the MOS transistor, and L is the distance between the source and drain, or the channel length. A minimum channel length that has been achieved to date is nearly 1.5 $\mu$m.

To make W/L larger, it is necessary to make L smaller and W larger. With higher integration, however, it is impossible to increase W as desired and a maximum value recently achieved is as small as 2,500 $\mu$m.

On the other hand, to reduce the size of a chip into which more and more semiconductor components are being squeezed, a CMOS inverter circuit is usually used in the output circuit.

FIG. 1 shows an equivalent circuit for a conventional output circuit built in a CMOS IC.

The output circuit is an inverter circuit comprising a p-channel MOS transistor 11 and an n-channel MOS transistor 12. The source of the p-channel MOS transistor 11 is connected to the positive power supply Vcc, whereas the source of the n-channel MOS transistor 12 is connected to the negative power supply Vss. The drains of both MOS transistors 11 and 12 are connected to each other, and this common drain is then connected to the output terminal 13.

Similarly, the gates of both MOS transistors 11 and 12 are connected to one another, and this common gate receives the IC internal signal.

The inverter is formed on an IC chip such as a silicon semiconductor, which is housed in a package made of synthetic resin, ceramic, or the like. On the IC chip, a plurality of pads including a power supply pad are formed. The transmission and reception of signals and supply voltages between these pads and external circuitry are performed via the lead frame, boding wires, and others.

In FIG. 1, parasitic inductances and capacitances on the lead frame, bonding wires, and others are indicated by reference characters L1 through L3 and C1 through C3. RL and CL represents the load resistance and capacitance, respectively.

In the inverter circuit, the parasitic components cause overshoot and undershoot in the output waveform. Such overshoot and undershoot increase in proportion to the magnitude of the output current from the inverter circuit, or the W/L of the MOS transistor.

For example, it is assumed that the W/L of the p-channel MOS transistor 11 is 1,690 $\mu$m/1.5 $\mu$m and that for the n-channel MOS transistor 12 is 704 $\mu$m/1.5 $\mu$m.

It is also assumed that for the lead frame, boding wires, and other, each of the parasitic capacitances C1, C2, and C3 is 10 pF, and each of the parasitic inductances L1, L2, and L3 is 13 nH. Further, it is assumed that the load capacitance CL is 50 pF; the load resistance RL 500 $\Omega$; the voltage of the positive power supply Vcc+5V; and the voltage of the negative power supply Vss 0V.

Under such conditions, when the signals supplied to the gates of both MOS transistors 11 and 12 were changed, a waveform simulating the resulting changes in the output signal was obtained, as shown in FIG. 2, by the SPICE simulation.

As seen from FIG. 2, an output waveform corresponding to the switching of the input signal has overshoot and undershoot. As a result, the output terminal 13 suffers from ringing whose voltage peak is nearly 4.1V, which is the difference between the 1.6V undershoot and the −2.5V overshoot.

The parasitic components cause overshoot and undershoot in the output waveform because current changes. Recent higher-speed semiconductor devices, however, involves larger changes in current, which increases the effects of parasitic inductance and capacitance to the extend that cannot be neglected.

In a system composed of a plurality of ICs, for example, CMOS ICs, with the positive supply voltage being 5V, the noise margin of each IC normally has a maximum $V_{IL}$ of 1.5V on the low level side and a minimum $V_{IH}$ of 3.5V on the high level side. In driving such ICs, if ringing takes place at the output terminal, this will cause the driven ICs to receive the input voltage that exceeds the input noise margin, leading to an increase in drawn current in the driven ICs and faulty operation.

SUMMARY OF THE INVENTION

Accordingly, the object of the present invention is to provide a CMOS output circuit that suppresses ringing in the output signal and prevents an increase in drawn current in the driven semiconductor integrated circuits and faulty operation.

The foregoing object is accomplished by a CMOS output circuit, comprising: a first power supply; a second power supply; a signal output terminal; a first MOS transistor of a first channel, which has one of its source and drain connected to the first power supply; a second MOS transistor of the first channel, which has one of its source and drain connected to the other of the source and drain of the first MOS transistor, and the other of its source and drain connected to the output terminal; a third MOS transistor of a second channel, which has one of its source and drain connected to the second power supply; a fourth MOS transistor of the second channel, which has one of its source and drain connected to the other of the source and drain of the third MOS transistor, and the other of its source and drain connected to the output terminal; a first diode whose anode and cathode are connected to one and the other of the source and drain of the first MOS transistor, respectively; and a second diode whose anode and cathode are connected to one and the other of the source and drain of the third MOS transistor, respectively.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a circuit diagram for a CMOS output circuit according to a first embodiment of the present invention;

FIG. 4 is a characteristic diagram for a diode used in the output circuit of FIG. 3;

DETAILED DESCRIPTION OF THE PREFERRED EMBODIMENTS

Referring to the accompanying drawings, the present invention will be explained by using embodiments.

Figure 1:
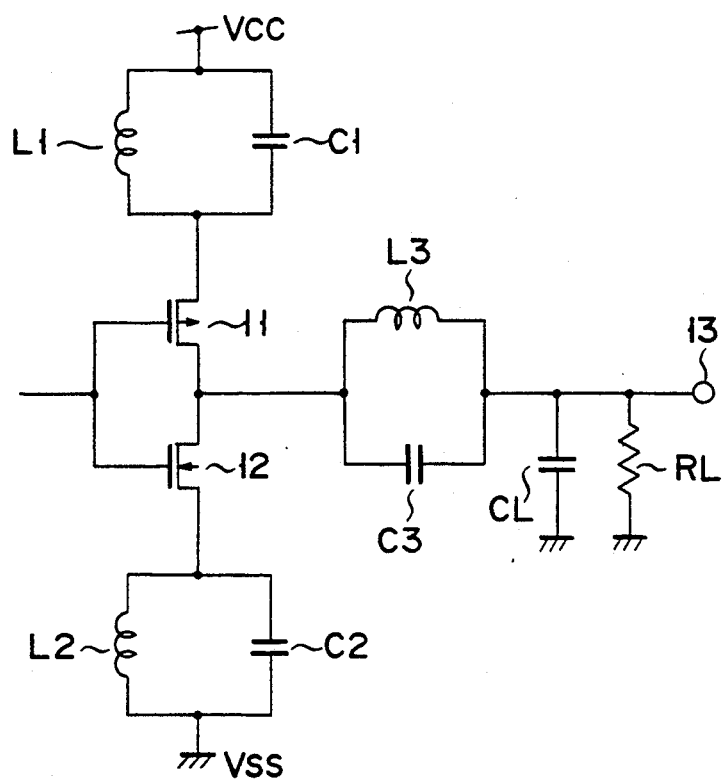
FIG. 1 is a circuit diagram for a conventional output circuit built in a CMOS IC.
Figure 2:
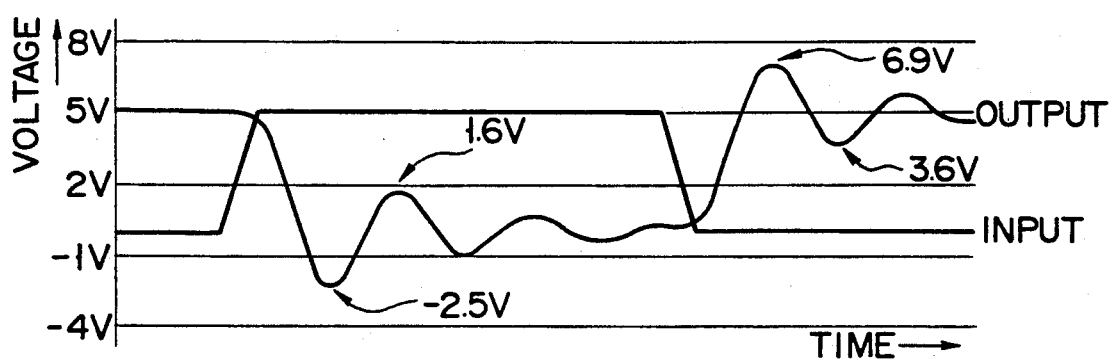
FIG. 2 shows an output waveform for the output circuit of FIG. 1.

FIG. 3 is a circuit diagram for a CMOS output circuit according to a first embodiment of the present invention. The parts corresponding to those of the conventional circuit FIG. 1 are indicated by the same reference characters and their detailed explanation will be omitted.

The output circuit in this embodiment is basically an inverter circuit composed of the p-channel MOS transistor 11 and n-channel MOS transistor 12. It also contains a p-channel MOS transistor 14, an n-channel MOS transistor 15, and two diodes 16 and 17, which are added to the conventional output circuit.

The p-channel MOS transistor 14 has its source connected to the positive power supply Vcc, its drain to the source of the p-channel MOS transistor 11, and its gate to the gate of the MOS transistor 11. The n-channel MOS transistor 15 has its source connected to the negative power supply Vss, its drain to the source of the n-channel MOS transistor 12, and its gate to the gate of the MOS transistor 12.

One diode 16 has its anode connected to the source of the MOS transistor 1 and its cathode to the drain of the MOS transistor 14. The other diode 17 has its anode connected to the drain of the MOS transistor 15 and its cathode to the source of the MOS transistor 15.

In FIG. 3, parasitic inductances and capacitances on the lead frame, boding wires, and others are indicated by L1 through L3 and C1 through C3. RL and CL represent the load resistance and the load capacitance, respectively.

That is, the arrangement of the output circuit of this embodiment is such that the p-channel MOS transistor 14 is inserted between the inverter made up of the MOS transistors 11 and 12 and the positive power supply Vcc, with the diode 16 being connected, in the forward direction, in parallel with the current path between the source and drain of the MOS transistor 14. Further, the n-channel MOS transistor 15 is inserted between the inverter circuit and the negative power supply Vss, with the diode 17 being connected in parallel with the current path between the source and drain of the MOS transistor 15.

The conductance gm of the p-channel MOS transistor 14 is sufficiently smaller than that of the p-channel MOS transistor 11. Similarly, the conductance gm of the n-channel MOS transistor 15 is sufficiently smaller than that of the N-channel MOS transistor 12.

The operation of the output circuit will now be described. It is assumed that the input supplied to the common gate of the four MOS transistors 11, 12, 14, and 15 changes from the low (L) level to the high (H) level. It is also assumed that before the input changes, the output terminal 13 has been charged to the H level.

When the input goes to the H level, then both n-channel MOS transistors 12 and 15 turn on. At this time, current flows from the output terminal 13, which is previously charged to the H level, to the negative power supply Vss, via the MOS transistor 12 and diode 17 in series. This makes the potential (the output potential) of the output terminal 13 drop rapidly. When the output potential approaches the forward voltage drop VF of the diode 17, the output current starts to diminish.

The decreasing current causes counter electromotive forces in the inductances L2 and L3, which makes the output potential lower than the potential of the negative power supply Vss. Then, current tends to flow from the negative power supply Vss back to the output terminal 13, which makes the diode 17 reverse-biased.

Figure 5:
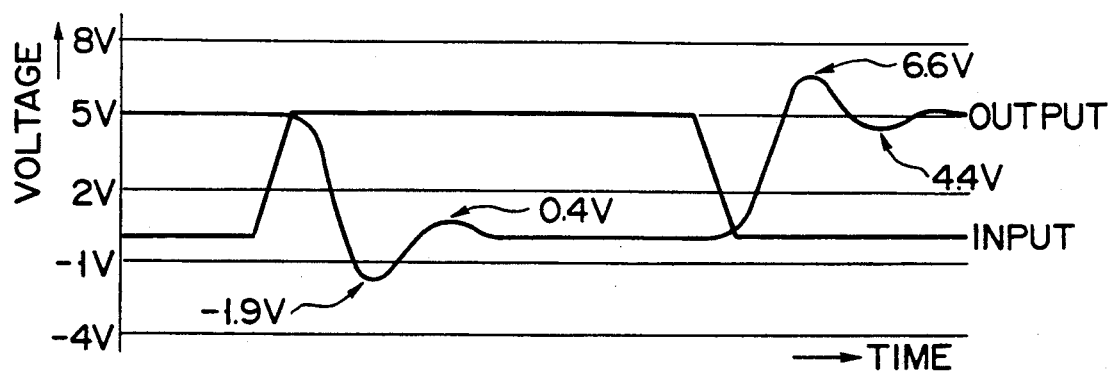
FIG. 5 illustrates an output waveform for the output circuit of FIG. 3.

FIG. 4 illustrates a typical voltage-current characteristics of diode. As seen from the characteristics, the reverse-biased diode carries almost no current. Thus, in this case, current flows to the output terminal 13 via the MOS transistor 15 whose conductance gm is small. The small conductance gm permits only a small current to flow through the MOS transistor 15, with the result that ringing appearing at the output terminal 13 is extremely small as shown in FIG. 5. For example, undershoot of 0.4V and overshoot of $-1.9$ were obtained as shown in the figure, meaning that the voltage peak of ringing was suppressed to approximately 2.3V.

Next, when the input changes from the high (H) level to the low (L) level, both p-channel MOS transistors 14 and 11 turn on. At this time, current flows from the positive power supply Vcc to the output terminal 13 previously discharged to the L level, via the diode 16 and the MOS transistor 11 in series. This makes the output potential rise rapidly. When the out put potential approaches a potential lower than Vcc by the forward voltage drop VF of the diode 16, the output current starts to diminish.

The decreasing current causes counter electromotive forces in the inductances L1 and L3, which makes the output potential higher than the potential of the positive power supply Vcc. Then, current tends to flow from the output terminal 13 to the positive power supply Vcc, which makes the diode 16 reverse-biased, allowing almost no current to flow through the diode 16. Therefore, in this case, current flows toward the positive power supply Vcc via the p-channel MOS transistor 14 whose conductance gm is small.

Since the small conductance gm permits only a small current to flow through the MOS transistor 14, ringing that occurs at the output terminal 13 is extremely small as shown in FIG. 5. For example, under these conditions, the voltage peak of ringing was suppressed to nearly 2.2V as shown in the figure.

In the above embodiment, the p-channel MOS transistor 14 and the n-channel MOS transistor 15 are provided to set the output potential at the potentials of Vcc and Vss, respectively. This makes it unnecessary to supply large current after the charging/discharging of the load capacitor, when the driven circuit connected to the output terminal 13 is a voltage control element, such as a MOS transistor. Thus, using MOS transistors with small conductance gm as the transistors 14 and 15 have no adverse effect. For example, in the above embodiment, MOS transistors whose channel length (L) was nearly 1.5 μm were used, and the W/L for each MOS transistor used were: 2,500 μm/1.5 μm for MOS transistor 11; 350 μm/1.5 μm for MOS transistor 14; 700 μm/1.5 μm for MOS transistor 12; and 80 μm/1.5 μm for MOS transistor 15.

In the conventional circuit of FIG. 1, the signal transfer time $t_{PLH}$ (the time interval from when the input potential is 0.5 Vcc until the output potential reaches 0.5 Vcc, when the input signal falls while the output potential rises) was 4.5 nsec, whereas $t_{PHL}$ (the time interval from when the input potential is 0.5 Vcc until the output potential reaches 0.5 Vcc, when the input signal rises while the output potential drops) was 5 nsec. In the circuit according to the above embodiment, $t_{PLH}$ was 5 nsec and $t_{PHL}$ was 5.5 nsec, almost the same delay times as those of the conventional circuit. Thus, the output circuit of this embodiment can achieve high speed operation as with the conventional one.

Although the diodes 16 and 17 carry large current, the simulation of the peak currents for both diodes showed that no more 80 mA would flow, the value being far below the current limits of ±300 mA at which latch-up operation occurs in ordinary CMOS logic ICs. Therefore, use of diodes does not introduce the danger of latch-up operation taking place.

Figure 6:
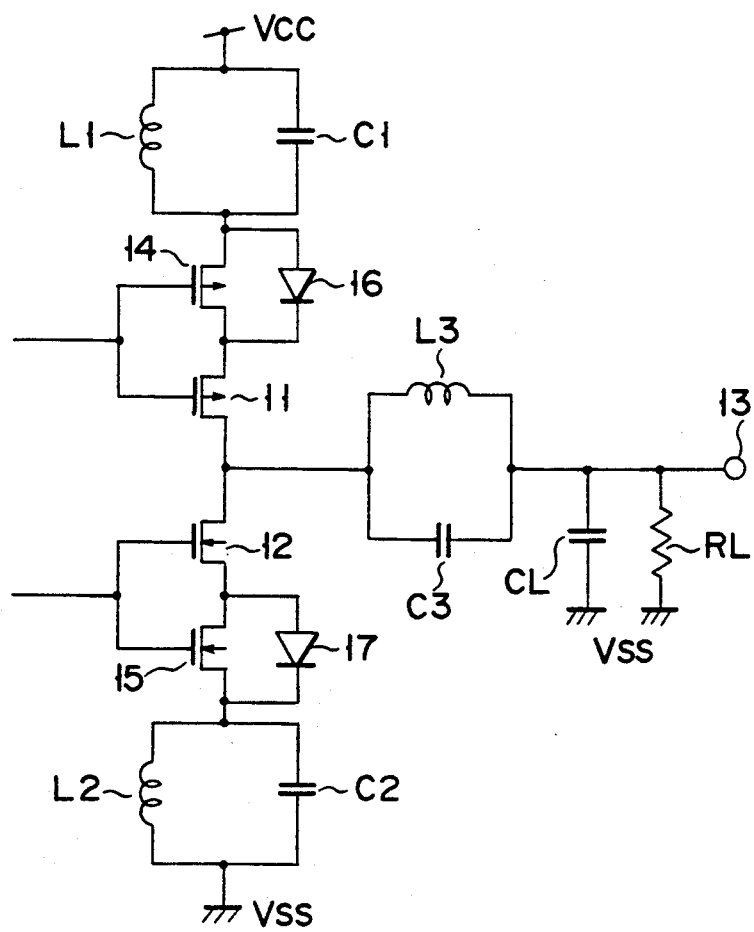
FIG. 6 is a circuit diagram of a CMOS output circuit according to a second embodiment of the present invention.

FIG. 6 is a circuit diagram for a CMOS output circuit according to a second embodiment of the present invention. The difference between the circuit of the second embodiment and that of the first embodiment of FIG. 3 is that in the FIG. 3 circuit, the gates of four MOS transistors 11, 12, 14, and 15 are connected to each other to form a common gate, to which the same signal is supplied. In the circuit of the second embodiment, however, the gates of two p-channel MOS transistors 11 and 14 are connected to one another, while the gates of two n-channel MOS transistor 12 and 15 are connected to each other. This arrangement allows separate signals to be supplied to the p-channel side and n-channel side, respectively.

In the first embodiment circuit, the MOS transistors on the p-channel side and n-channel side turn on and off almost simultaneously. In the second embodiment circuit, however, the gates of the MOS transistors on the p-channel side and n-channel side can be controlled independently, which makes it possible to freely set off-to-on changeover timing or on-to-off changeover timing for each channel side.

This invention may be practiced and embodied in still other ways without departing from the spirit or essential character thereof. For instance, in both embodiments, the p-channel and n-channel MOS transistors 14 and 15, to which the diodes 16 and 17 are connected in parallel respectively, are provided on the positive power supply Vcc side and negative power supply Vss side, with respect to the MOS transistors 11 and 12, respectively. However, connection may be modified so as to place the parallel diode-connected MOS transistors 14 and 15 on side of the output terminal 13.

As describe so far, an output circuit according to this invention is able to suppress ringing that takes place in the output.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A CMOS output circuit comprising:
   a first power supply of high potential;
   a second power supply of low potential;
   a signal output terminal;
   a first MOS transistor of a P-channel type having a source, a drain and a gate, said source being connected to said first power supply;
   a second MOS transistor of a P-channel type having a source, a drain and a gate, said source connected to the drain of said first MOS transistor, said drain being connected to said signal output terminal;
   a third MOS transistor of an N-channel type having a source, a drain and a gate, said source being connected to said second power supply;
   a fourth MOS transistor of an N-channel type having a source, a drain and a gate, said source connected to the drain of said third MOS transistor, said drain connected to said signal output terminal wherein each said gate of said first, second, third and fourth MOS transistor receives a first or a second input signal;
   a first diode having an anode connected to the source of said first MOS transistor, and a cathode connected to the drain of said first MOS transistor; and
   a second diode having an anode connected to the drain of said third MOS transistor, and a cathode connected to the source of said third MOS transistor.

2. A CMOS output circuit according to claim 1, wherein the gate of said second MOS transistor and the gate of said fourth MOS transistor are connected to each other.

3. A CMOS output circuit according to claim 1, wherein:
   the gate of said first MOS transistor and the gate of said second MOS transistor are connected to each other,
   the gate of said third MOS transistor and the gate of fourth MOS transistor are connected to each other.

4. A CMOS output circuit according to claim 1, wherein:
   the conductance of said first MOS transistor is set smaller than that of said second MOS Transistor,
   the conductance of said third MOS transistor is set smaller than that of said fourth MOS transistor.

* * * * *